United States Patent
Kaynak et al.

(10) Patent No.: US 11,705,925 B2
(45) Date of Patent: Jul. 18, 2023

(54) DYNAMIC BIT FLIPPING ORDER FOR ITERATIVE ERROR CORRECTION

(71) Applicant: Micron Technology, Inc., Boise, ID (US)

(72) Inventors: Mustafa N. Kaynak, San Diego, CA (US); Sivagnanam Parthasarathy, Carlsbad, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 17/899,495

(22) Filed: Aug. 30, 2022

(65) Prior Publication Data

US 2022/0416815 A1    Dec. 29, 2022

Related U.S. Application Data

(63) Continuation of application No. 17/223,910, filed on Apr. 6, 2021, now Pat. No. 11,463,112.

(51) Int. Cl.
*H03M 13/37*    (2006.01)
*G06F 11/10*    (2006.01)

(52) U.S. Cl.
CPC ..... *H03M 13/3753* (2013.01); *G06F 11/1076* (2013.01)

(58) Field of Classification Search
CPC .................. H03M 13/3753; G06F 11/1076
See application file for complete search history.

(56) References Cited

U.S. PATENT DOCUMENTS

| | | |
|---|---|---|
| 2004/0039769 A1 | 2/2004 | Orio |
| 2010/0169746 A1* | 7/2010 | Karabed ............... G11B 20/18 714/795 |
| 2016/0266971 A1 | 9/2016 | Torii et al. |
| 2017/0117925 A1 | 4/2017 | Achtenberg et al. |
| 2019/0056991 A1 | 2/2019 | Kim |

OTHER PUBLICATIONS

Non-Final Office Action, U.S. Appl. No. 17/223,910, dated Mar. 11, 2022, 15 pages.
Notice of Allowance, U.S. Appl. No. 17/223,910, dated Jun. 10, 2022, 16 pages.

* cited by examiner

*Primary Examiner* — Kyle Vallecillo
(74) *Attorney, Agent, or Firm* — Nicholson De Vos Webster & Elliott LLP

(57) ABSTRACT

Methods, systems, and apparatuses include receiving a codeword stored in a memory device. The codeword is error corrected for a first number of iterations. The error correction includes traversing the codeword according to a first order. The codeword is error corrected for a second number of the iterations. The error correction of the codeword during a second iteration from the second number of iterations includes traversing the codeword according to a second order that is different from the first order.

18 Claims, 7 Drawing Sheets

FIG. 3

| Iteration | Syndrome Start | Syndrome End |
|---|---|---|
| 0 | 504 | 200 |
| 1 | 200 | 76 |
| 2 | 76 | 46 |
| 3 | 46 | 38 |
| 4 | 38 | 36 |
| 5 | 36 | 34 |
| 6 | 34 | 32 |
| 7 | 32 | 30 |
| 8 | 30 | 30 |
| 9 | 30 | 50 |
| 10 | 50 | 24 |
| 11 | 24 | 12 |
| 12 | 12 | 12 |
| 13 | 12 | 28 |
| 14 | 28 | 18 |
| 15 | 18 | 12 |
| 16 | 12 | 12 |
| 17 | 12 | 28 |
| 18 | 28 | 18 |
| 19 | 18 | 12 |
| 20 | 12 | 12 |
| 21 | 12 | 4 |

Stall pattern 302 (iterations 12–19)

300

DYNAMIC BIT FLIPPING ORDER FOR ITERATIVE ERROR CORRECTION

CROSS-REFERENCE TO RELATED APPLICATION

The present application is a continuation of U.S. patent application Ser. No. 17/223,910 filed Apr. 6, 2021, which is hereby incorporated by reference.

TECHNICAL FIELD

The present disclosure generally relates to error correction in memory devices, and more specifically, relates to dynamic bit flipping Order for iterative error correction.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 3 illustrates a block diagram of an exemplary table including a stall pattern, in accordance with some embodiments of the present disclosure.

DETAILED DESCRIPTION

Figure 1:
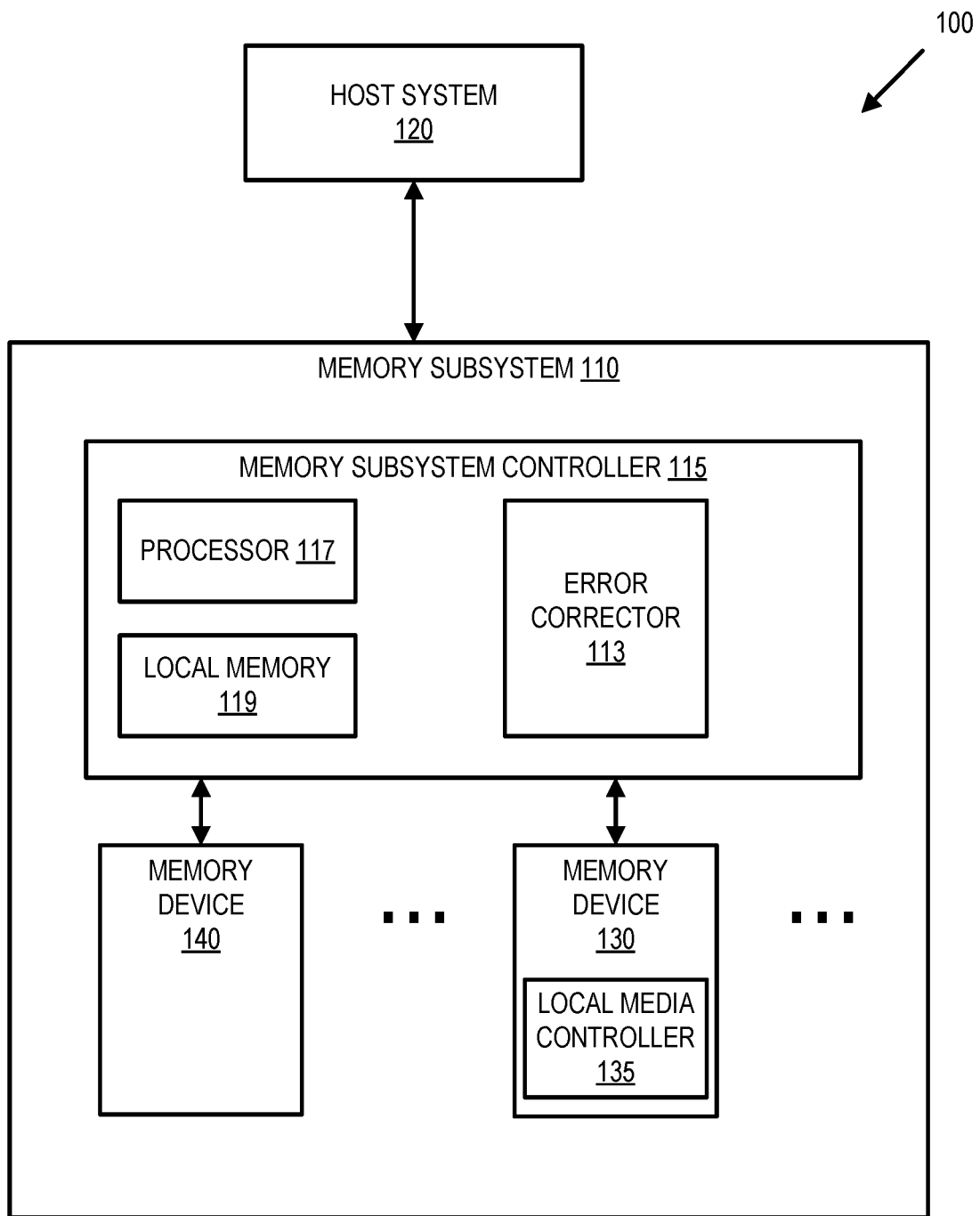
FIG. 1 illustrates an example computing system that includes a memory subsystem in accordance with some embodiments of the present disclosure.

Aspects of the present disclosure are directed to dynamic bit flipping order for iterative error correction in a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), and quad-level cells (QLCs). For example, a SLC can store one bit of information and has two logic states.

Low-Density Parity Check (LDPC) codes are commonly used for enabling error correction in memory subsystems. LDPC codes are a class of highly efficient linear block codes that include single parity check (SPC) codes. LDPC codes have a high error correction capability and can provide performance close to channel capacity. The MinSum algorithm (MSA), which is a simplified version of belief propagation algorithm, can be used for decoding LDPC codes. However, MSA-based decoders use a relatively high amount of energy per bit (e.g., pico-joule per bit) for decoding codewords and hence are not well suited for energy conscious applications (such as mobile applications). Bit Flipping (BF) decoders have been introduced to address this problem. BF decoders use less energy per bit at the expense of providing lower error correction capability when compared to the error correction capability of MSA-based decoders. Lower error correction capability is an obstacle to the deployment of BF decoders for replacing MSA-based decoders. In particular, BF decoders are subject to false flips. In a false flip, a BF decoder flips a bit that was already correct. False flips are problematic for BF decoder because by flipping wrong bits in a failed parity, the parity becomes satisfied and consequently the bit that caused the parity failure becomes more reliable and is less likely to get corrected in subsequent iterations of the BF decoder.

Aspects of the present disclosure address the above and other deficiencies by improving the error correction capability of BF decoders. The embodiments presented herein allow a BF decoder to approach error correction capability of an MSA-based decoder. The codeword error rate (CWER) is significantly reduced where CWER refers to the rate (probability) at which a BF decoder fails to correct errors and a sequence of error recovery steps is triggered.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes an error corrector 113 that can dynamically change the bit flipping order when error correcting a codeword. In some embodiments, the controller 115 includes at least a portion of the error corrector 113. For example, the controller 115 can include a processor 117 (processing device) configured to execute instructions stored in local memory 119 for performing the operations described herein. In some embodiments, an error corrector 113 is part of the host system 110, an application, or an operating system.

The error corrector 113 can modify the bit flipping order from an iteration to another iteration. In one embodiment, the error corrector 113 receives a codeword stored in a memory device. The error corrector 113 error corrects the codeword in a set of iterations, e.g., by flipping bits for one or more iterations based on parity checks and channel information. The error correction of the codeword during the first set of iterations includes traversing the bits of the codeword according to a given order. The error corrector 113 is operative to flip bits in the codeword for another set of one or more iterations. The error correction of the codeword during the second set of iterations includes traversing the codeword according to an order that is different from the order of the previous set of iterations. Further details with regards to the operations of the error corrector 113 are described below.

Although illustrated as a single component, the error correction component 113 can be provided as a separate encoding component (e.g., for encoding data to be stored in the memory device 110 as codewords) and a separate decoding component (e.g., for decoding data stored in the memory device 110).

Figure 2:
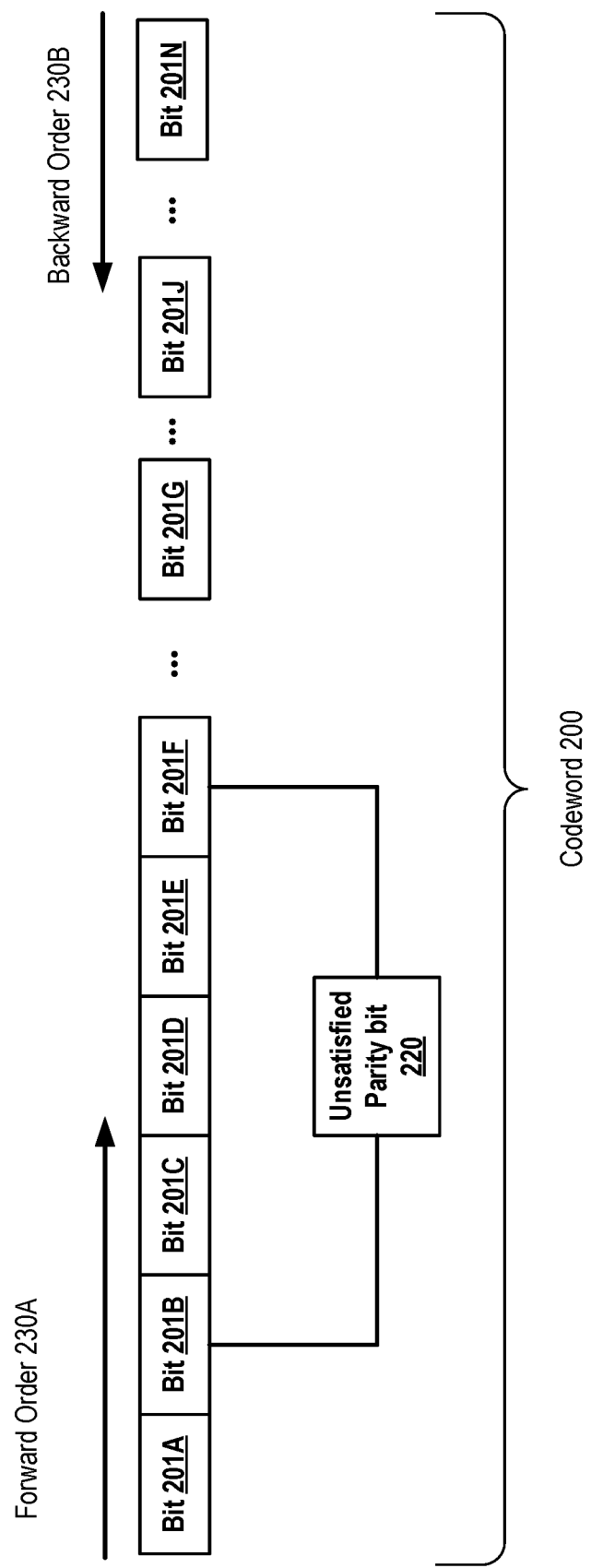
FIG. 2 illustrates a block diagram of a codeword that can be corrected according to multiple orders, in accordance with some embodiments of the present disclosure.

FIG. 2 illustrates a block diagram of a codeword that can be corrected according to multiple orders, in accordance with some embodiments of the present disclosure. Bits of data are encoded (e.g., by the error corrector 113) as the codeword 200 to be stored in the memory device. The codeword is stored in a memory device, e.g., memory device 130 or memory device 140. In some embodiments, the bits are encoded according to an LDPC code. The codeword 200 includes multiple data bits 201A-N. The codeword can include the data bits 201A-N as well as parity check bits, e.g., parity bit 220. Parity bit 220 is related to bit 201B and to bit 201F. In this example, parity bit 220 is unsatisfied indicating that one of bit 201B and 201F is erroneous. In this example, 201B is a correct bit while 201F is an erroneous bit. While a single parity 220 is illustrated, it is to be understood that the codeword 200 includes multiple parity bits for the multiple bits. The codeword 200 is read from the memory device. The read codeword can include one or more erroneous bits that can be corrected by the error corrector 113 before being transmitted to a host, e.g., host system 120. The error corrector 113 is operative to error correct the codeword 200 in one or more iterations according to a given order and one or more subsequent iterations according to another order that is different from the given order. In some embodiments, the error corrector 113 is operative to traverse the codeword from bit 201A towards bit 201N for N iterations, where N is one or more. This order can be referred to as a forward order 230A. The error corrector 113 is operative to traverse the codeword 200 from bit 201N towards bit 201A for M iterations, where M is one or more. This order can be referred to as a backward order 230B. In some embodiments, the error corrector 113 can traverse the codeword 200 in the backward order 230B in one or more iterations before changing the order to a forward order 230A in one or more subsequent iterations.

Figure 4:
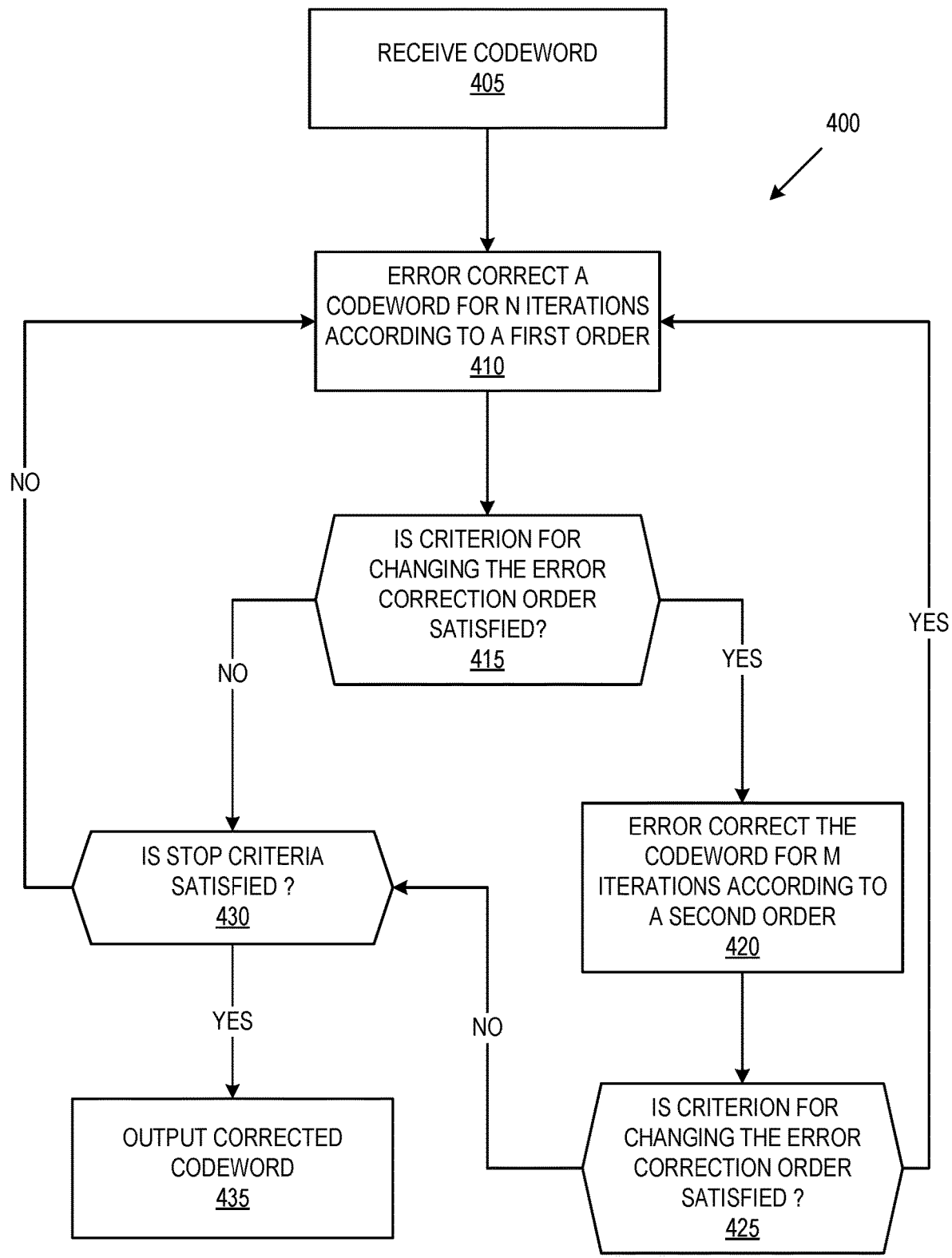
FIG. 4 is a flow diagram of an example method that provides a dynamic bit flipping order for iterative error correction in accordance with some embodiments of the present disclosure.

FIG. 4 is a flow diagram of an example method 400 to dynamically modify the bit flipping order for iterative error correction, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the error corrector 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, the processing device receives a codeword from a memory device, e.g., codeword 200. In some embodiments, the codeword is received as a result of a read operation from a host system 120. The codeword can include a combination of data bits and parity check bits. The parity check bits are stored in the memory device along with the data bits.

At operation 410, the processing device decodes the codeword by performing error corrections of bits within the codeword for a number of iterations according to a given order. For example, the processing device can correct the codeword 200 for one or multiple iterations according to a forward order as described above. The error correction of the codeword 200 includes traversing the codeword 200 in the given order. Continuing the example above, the processing device traverses the codeword 200 from bit 201A to bit 201N and flips a bit when a bit flipping criterion is satisfied for the bit. In some embodiments, the given order is a default order that enables a lower codeword error rate (CWER) when compared with a CWER of another order. In some embodiments, the order can be an order defined according to bits that are vulnerable to false flips as described in further detail with reference to FIG. 6.

In some embodiments, the processing device determines whether to flip a bit or not based on the bit flipping criterion and an energy function of the bit. An energy function of a codeword bit can be considered an indication of reliability information for the codeword bit. An energy function of a codeword bit can be determined based on a number of parity violations per codeword bit (e.g., a higher number of parity violations is a sign of less reliable bit) and channel information. The channel information is determined based on a current state of the bit versus what was read from a memory device. When the current state of the bit (after one or more iterations) agrees with the bit that was read from the memory device, the bit is considered to be more reliable. In some embodiments, an energy function of a bit can be determined by a adding a number of parity violations of the bit with channel information for the bit which can be defined as an XOR of the current state of the bit and the bit read from the memory device. In a non-limiting example, an energy function can be determined according to equation (2):

$$e(bit)=NumberSatisfiedParities(bit)+Channel\ information(bit) \quad (2)$$

Where higher e(bit) refers to less reliable bit. In some embodiments, the bit flipping criterion is a bit flipping threshold. The processing device determines to flip a codeword bit when the energy function of the codeword bit satisfies the bit flipping threshold. For example, the processing device can determine to flip a codeword bit when the energy function is greater than the bit flipping threshold. In the example of FIG. 2, the codeword is traversed according to the forward order for one or more iterations. The bit 201B is associated with a parity 220 that is unsatisfied. This causes the bit to be flipped. When the bit is flipped, the parity bit 220 becomes satisfied for the two bits, bit 201B and 201F, and the energy function for bit 201F decreases resulting in bit 201F not being flipped. However, in this iteration a correct bit, 201B, is a false flip. The flow of operations moves to optional operation 415. In some embodiments, the operation 415 is skipped and method 400 proceeds to operation 420.

At operation 415, the processing device determines if a criterion for changing the error correction order is satisfied. In some embodiments, the processing device determines that the criterion is satisfied by determining that a threshold number of iterations has been reached. In other words, the processing device determines if the codeword was error corrected according to the given order, e.g., the default order, for the threshold number of iterations. The threshold number of iterations can be 1 iteration, two iterations, or N iterations. In some embodiments, the processing device determines that the criterion is satisfied when it detects a stall condition in the performed iterations. The stall condition is detected when the processing device oscillates between multiple states, i.e., for several consecutive iterations the processing device moves from one state to another with a period of iterations.

FIG. 3 illustrates a block diagram of an exemplary table including a stall pattern detected by the processing device and that triggers the changing of the error correction order. As an example, the table of FIG. 3 shows the syndrome number at the start and end of an iteration of error correction of a codeword. For this example, the processing device starts oscillating at iteration 12 and the period of oscillation is 4. The stall pattern 302 is repeated a second time (from iteration 16 to iteration 19). This stall pattern can be continuously repeated for multiple iterations. The processing device detects the stall pattern, e.g., stall pattern 302, in the syndromes that result from the error correction of the codeword in consecutive iterations. For example, the processing device can store multiple consecutive syndromes generated during iterations of error correction of the codeword and compare successive sets of these syndromes to identify a stall pattern that repeats over multiple sets of iterations. In the example of FIG. 3, the processing device can identify the stall pattern 302 as a repeating pattern between iterations 12-15 and iterations 16-19. In some embodiments, the processing device can detect the stall condition in multiple iterations by hashing multiple syndromes that result from the error correction of the codeword in the multiple iterations and comparing the hash value with a hash value resulting from hashing other syndromes resulting from the error correction of the codeword in other iterations. For example, the processing device can generate a hash value from the syndromes of iterations 12-15, and another hash value from the syndromes of iterations 16-19. The processing device compares the two hash values to determine that the iterations 12-15 and the iterations 16-19 have a similar pattern that is repeating.

When the criterion for changing the error correction order is satisfied, the flow of operations moves to operation 420. When the criterion for changing the error correction order is not satisfied the flow of operations moves to operation 430.

At operation 420, the processing device continues error correction of the codeword according to another order for one or more iterations. The error correction of the codeword 200 includes traversing the codeword 200 in this other order that is different from the given order used at operation 410. For example, the processing device can correct the codeword 200 for one or multiple iterations according to a backward order. The processing device traverses the codeword 200 from bit 201N to bit 201A and flips a bit when a bit flipping criterion is satisfied for the bit. In some embodiments, the order can be an order defined according to bits that are vulnerable to false flips. This order can be determined as described in further detail with reference to operation 610 of FIG. 6. For example, the processing device can correct the codeword 200 for one or multiple iterations according to this order. Upon identifying that the regions of bits 201G to 201J is more vulnerable to false bits than other bits of the codeword, the processing device can traverse the codeword forward from bit 201A to 201F, backward from 210N to 201K, and finally forward from 201G to 201J. In some embodiments, the processing device determines whether to flip a bit or not based on the bit flipping criterion and an energy function of the bit. In some embodiments, the bit flipping criterion is a bit flipping threshold. The processing device determines to flip a codeword bit when the energy function of the codeword bit satisfies the bit flipping threshold. For example, the processing device flips a bit when the energy function is greater than the bit flipping threshold. Referring back to the example of FIG. 2, if the codeword is traversed according to the backward order, starting from the bit 201N to bit 201A. The bit 201F is associated with a parity 220 that is unsatisfied. This causes the bit to be flipped. When the bit is flipped, the parity bit 220 becomes satisfied for the two bits bit 201B and 201F and bit 201B no longer needs to be flipped. In this iteration the erroneous bit 201F is flipped (true flip) and the correct bit 201B is maintained. There is no longer a false flip in the error correction of the codeword 200. Modifying the order of error correction of a codeword, by modifying the order by which the bits are flipped, enables the processing device to decrease the number of and/or avoid false flips and result in a decrease of the code word error rate.

At operation 425, the processing device determines if the criterion for changing the error correction order is satisfied. In some embodiments, operation 425 is skipped. The determination if the criterion for changing the error correction order is satisfied can be performed as described with reference to operation 415.

When the criterion for changing the error correction order is satisfied, the flow of operations moves to operation 410. At operation 410, the processing device continues to error correct the codeword in one or more iterations according to an updated order. In some embodiments, this updated order can be the initial order. In some embodiments, the updated order can be a different order (different from the order at operation 420 and different from the initial order).

When the criterion for changing the error correction order is not satisfied the flow of operations moves to operation 430. At operation 430, the processing device determines whether a stop criterion is satisfied. A stop criterion can include an indication that no errors are detected for the codeword. In some embodiments, the stop criterion can include a null syndrome indicating that the codeword no longer include erroneous bits. In some embodiments, the stop criterion can include a maximum number of iterations or a maximum amount of time. For example, the processing device is operative to perform the maximum number of iterations (e.g., 30 iterations, 40 iterations, 100 iterations, etc.), and when this number of iterations is performed, the resulting corrected codeword is output. When the stop criterion is satisfied, the flow of operations moves to operation 435. At operation 435, the processing device outputs the corrected codeword (or an indication of failure if the processing device was unable to decode the codeword). For example, the processing device can transmit the corrected codeword to the host 120.

Alternatively, when the stop criterion is not satisfied, the flow of operations moves to operation 410. At operation 410, the processing device continues to error correct the codeword in one or more iterations according to an updated order. In some embodiments, this updated order can be the initial order. In some embodiments, the updated order can be a different order (different from the order at operation 420 and different from the initial order).

In one embodiment, the processing device error corrects a codeword for N iterations according to a default order and subsequently error corrects the codeword for N+1 to M iterations according to a different order. In this embodiment, the processing device uses two orders of error correction. In one embodiment, the processing device can periodically switch between two or more orders, such that a first number of iterations is performed according to an initial order, a second number of iterations (which can be equal or different from the first number of iterations) according to a second order, and a third number of iterations is performed according to a third order, etc. The third order can be the same as or different from the initial order. In some embodiments, the processing device can alternate orders at each iteration. For example, a first iteration is performed according to a forward order, a next iteration is performed according to a backward order, the next iteration is performed according to the forward order, etc. Multiple scenarios of dynamic modification of the order for error correcting a codeword in multiple iterations can be contemplated without departing from the scope of the embodiments of the present disclosure.

Figure 5:
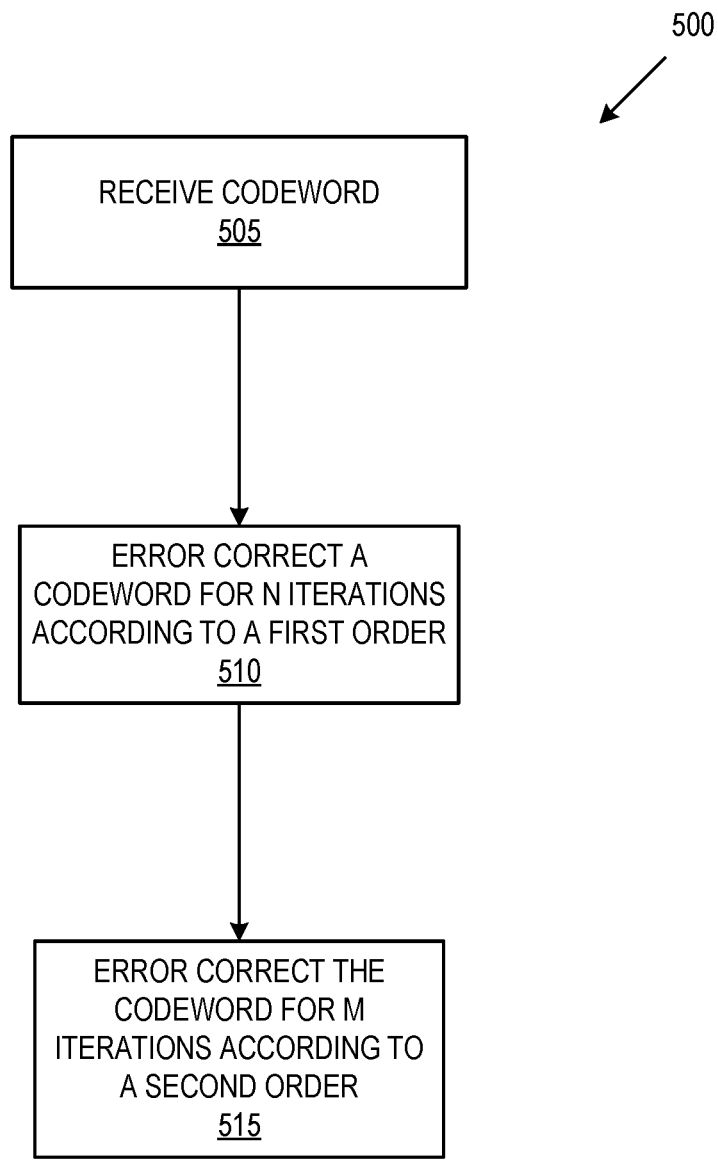
FIG. 5 is a flow diagram of another example method that provides a dynamic bit flipping order for iterative error correction in accordance with some embodiments of the present disclosure.

FIG. 5 is a flow diagram of another example method 500 to modify the error correction order, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the error corrector 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, the processing device receives a codeword from a memory device, e.g., codeword 200. In some embodiments, the codeword is received as a result of a read operation from a host system 120. The codeword can include a combination of data bits and parity check bits. The parity check bits are stored in the memory device for the data bits. The flow of operations moves to operation 510.

At operation 510, the processing device error corrects the codeword for a first number of multiple iterations. Error correcting the codeword at an iteration from the first number of iterations includes: traversing the codeword according to a first order. In some embodiments, error correcting the codeword at a first iteration includes determining locations of one or more bits in the codeword that satisfy the bit flipping criteria and flipping these bits to obtain an updated codeword. Flipping the bits can be performed according to a bit flipping criterion as described above. The processing device can perform several iterations according to the first order. Subsequent iterations can correct errors based on the updated codeword from a previous iteration. The flow of operations moves to operation 515.

At operation 515, the processing device error corrects the codeword for a second number of the multiple iterations according to a second order. The error correction of the codeword at a second iteration from the second number of the plurality of iterations includes traversing the codeword according to the second order that is different from the first order. In some embodiments, error correcting the codeword at the second iteration includes determining locations of one or more bits in the codeword that satisfy the bit flipping criteria and flipping these bits to obtain an updated codeword. Flipping the bits can be performed according to a bit flipping criterion as described above. The processing device can perform several iterations according to the second order.

Subsequent iterations can correct errors based on the updated codeword from a previous iteration.

Figure 6:
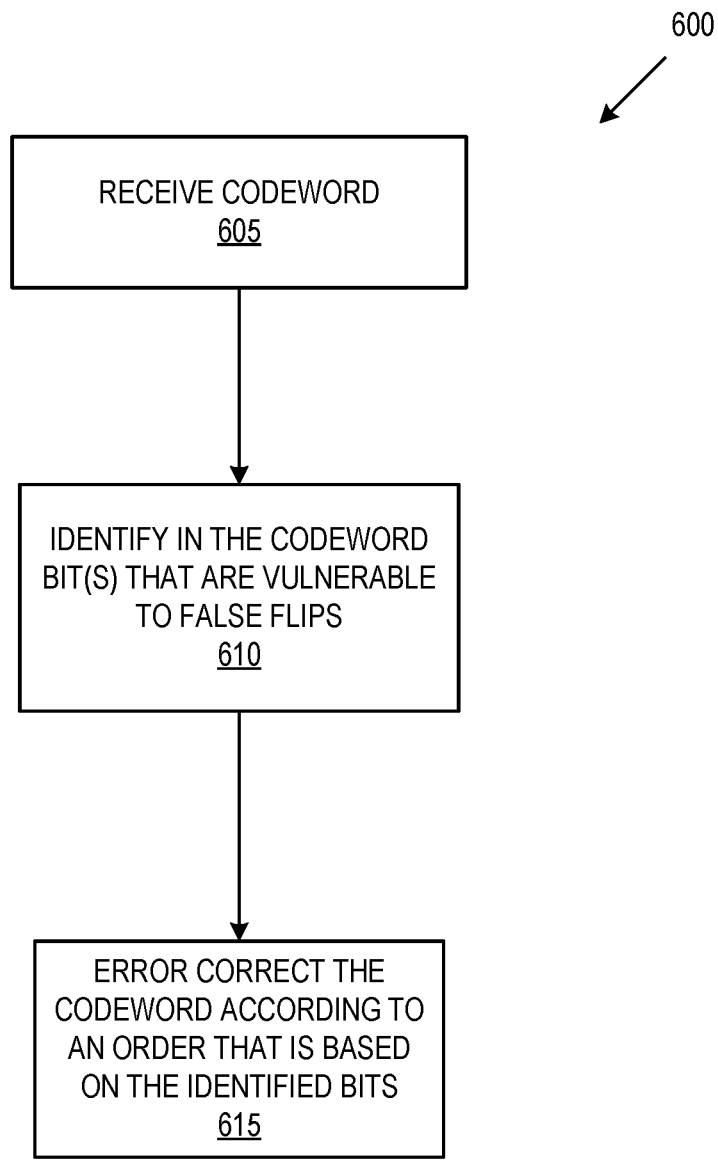
FIG. 6 is a flow diagram of another example method to error correct a codeword according to an order defined based on codeword bits that are vulnerable to false flips, in accordance with some embodiments of the present disclosure.

FIG. 6 is a flow diagram of another example method 600 to error correct a codeword according to an order defined based on codeword bits that are vulnerable to false flips, in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the error corrector 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 605, the processing device receives a codeword from a memory device, e.g., codeword 200. In some embodiments, the codeword is received as a result of a read operation from a host system 120. The codeword can include a combination of data bits and parity check bits. The parity check bits are stored in the memory device for the data bits. The flow of operations moves to operation 610.

At operation 610, the processing device identifies one or more codeword bits that are vulnerable to false flips. In some embodiments, some bits can be more vulnerable to false flips due to underlying problems in the LDPC code. In some embodiments, the identification of vulnerable codeword bits can be performed based on a type of code used for encoding the codeword. In some embodiments, the identification of vulnerable codeword bits includes performing an a-priori analysis of a parity check matrix of the error correction code (ECC). During the analysis of the parity check matrix, the processing device explores the connections between codeword bits and parity checks to identify trapping sets, stopping sets, or cycles. The processing device can determine which regions (i.e., bits) of the codeword are more vulnerable to stall conditions based on identified trapping sets, stopping sets, and/or cycles. As a non-limiting example, if there are many cycles in a region of the codeword the processing device can determine that this region is more vulnerable to the stall conditions.

In some embodiments, the identification of the vulnerable codeword bits can be performed through an analysis of errors that occur in multiple codewords over time and identifying regions of bits where false flips occur more frequently. The identified bits can be adjacent bits, e.g., bit 201A and bit 201B can be identified as bits prone to false flips. In some embodiments, the identified bits can be located in different regions of the codeword and may not be adjacent to one another, e.g., bit 201A and bit 201E.

At operation 615, the processing device corrects the codeword for a number of iterations according to an order defined based on the identified bits. For example, when the processing device identifies bits 201A and 201E as bits prone to false flips, the processing device can correct the codeword 200 for one or multiple iterations by traversing the codeword starting the error correction by other bits of the codeword and ending the error correction with bits 201A and 201E. The processing device traverses the codeword 200, where bits 201A and bit 201E are the last in the flipping order and flips a bit when a bit flipping criterion is satisfied for the bit. In some embodiments, the processing device determines whether to flip a bit or not based on the bit flipping criterion and an energy function of the bit. The processing device determines to flip a codeword bit when the energy function of the codeword bit satisfies the bit flipping threshold as described above. In some embodiments, the processing device can repeat the error correction of the codeword for multiple iterations. In some embodiments, the multiple iterations are performed according to a same order. In other embodiments, the processing device can be operative to modify the order of error correction of a codeword after one or more iterations as described above.

Figure 7:
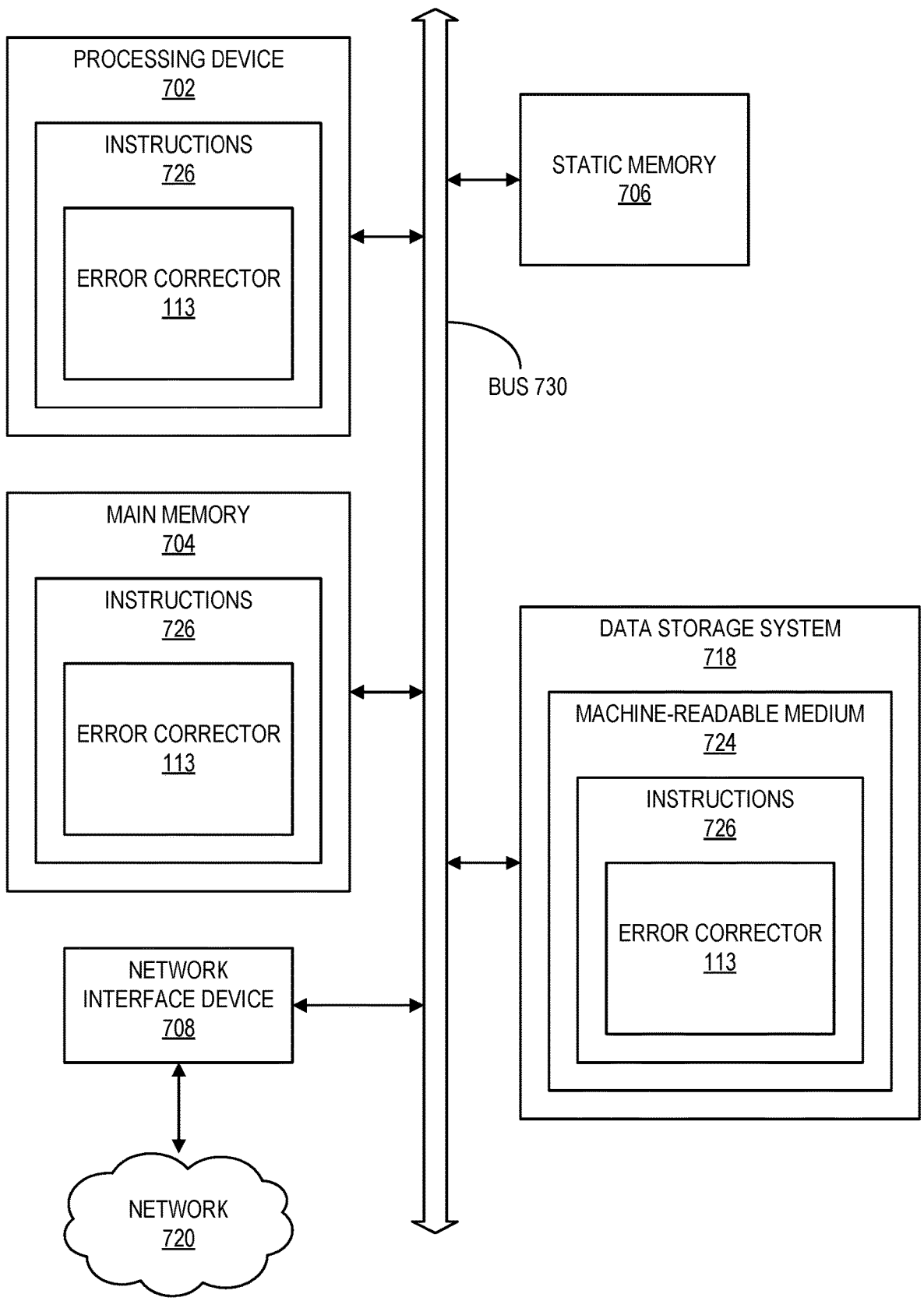
FIG. 7 is a block diagram of an example computer system in which embodiments of the present disclosure can operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the error corrector 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory subsystem 110 of FIG. 1.

In one embodiment, the instructions 726 include instructions to implement functionality corresponding to an error corrector (e.g., the error corrector 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, can carry out the computer-implemented methods 400, 500, and 600 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
    receiving a codeword stored in a memory device;
    identifying one or more bits in the codeword that are vulnerable to false flips by determining connections between the one or more bits and parity checks to identify trapping sets, stopping sets, or decoding cycles;
    determining a bit flipping order for a bit flipping decoder using the one or more bits in the codeword identified as vulnerable to false flips; and
    error correcting the codeword for one or more iterations by traversing the codeword according to the determined bit flipping order.

2. The method of claim 1, further comprising:
    traversing the codeword according to a different bit flipping order in response to determining that a criterion for changing an order of traversing the codeword is satisfied.

3. The method of claim 2, wherein the determining that the criterion for changing the order of traversing the codeword is satisfied includes:
    determining that a number of iterations satisfies a threshold number of iterations.

4. The method of claim 2, wherein the determining that the criterion for changing the order of traversing the codeword is satisfied includes:
    detecting a stall condition in a number of iterations.

5. The method of claim 4, wherein the detecting the stall condition includes:
- monitoring syndromes that result from the error correction of the codeword in the number of iterations; and
- detecting a stall pattern in syndromes that result from the error correction of the codeword in consecutive iterations from the number of iterations.

6. The method of claim 4, wherein the detecting the stall condition includes hashing syndromes that result from the error correction of the codeword in a plurality of iterations from the number of iterations.

7. A non-transitory computer-readable storage medium comprising instructions that, when executed by a processing device, cause the processing device to:
- receive a codeword stored in a memory device;
- identify one or more bits in the codeword that are vulnerable to false flips by determining connections between the one or more bits and parity checks to identify trapping sets, stopping sets, or decoding cycles;
- determine a bit flipping order for a bit flipping decoder using the one or more bits in the codeword identified as vulnerable to false flips; and
- error correct the codeword for one or more iterations by traversing the codeword according to the determined bit flipping order.

8. The non-transitory computer-readable storage medium of claim 7, wherein the instructions further cause the processing device to:
- traverse the codeword according to a different bit flipping order in response to determining that a criterion for changing an order of traversing the codeword is satisfied.

9. The non-transitory computer-readable storage medium of claim 8, wherein determining that the criterion for changing the order of traversing the codeword is satisfied includes:
- determine that a number of iterations satisfies a threshold number of iterations.

10. The non-transitory computer-readable storage medium of claim 8, wherein determining that the criterion for changing the order of traversing the codeword is satisfied includes:
- detecting a stall condition in a number of iterations.

11. The non-transitory computer-readable storage medium of claim 10, wherein detecting the stall condition includes:
- monitoring syndromes that result from the error correction of the codeword in the number of iterations; and
- detecting a stall pattern in syndromes that result from the error correction of the codeword in consecutive iterations from the number of iterations.

12. The non-transitory computer-readable storage medium of claim 10, wherein the detecting the stall condition includes hashing syndromes that result from the error correction of the codeword in a plurality of iterations from the number of iterations.

13. A system comprising:
- a memory device; and
- a processing device, operatively coupled with the memory device, to:
  - receive a codeword stored in a memory device;
  - identify one or more bits in the codeword that are vulnerable to false flips by determining connections between the one or more bits and parity checks to identify trapping sets, stopping sets, or decoding cycles;
  - determine a bit flipping order for a bit flipping decoder using the one or more bits in the codeword identified as vulnerable to false flips; and
  - error correct the codeword for one or more iterations by traversing the codeword according to the determined bit flipping order.

14. The system of claim 13, wherein the processing device is further to:
- traverse the codeword according to a different bit flipping order in response to determining that a criterion for changing an order of traversing the codeword is satisfied.

15. The system of claim 14, wherein determining that the criterion for changing the order of traversing the codeword is satisfied includes:
- determine that a number of iterations satisfies a threshold number of iterations.

16. The system of claim 14, wherein determining that the criterion for changing the order of traversing the codeword is satisfied includes:
- detecting a stall condition in a number of iterations.

17. The system of claim 16, wherein detecting the stall condition includes:
- monitoring syndromes that result from the error correction of the codeword in the number of iterations; and
- detecting a stall pattern in syndromes that result from the error correction of the codeword in consecutive iterations from the number of iterations.

18. The system of claim 16, wherein the detecting the stall condition includes hashing syndromes that result from the error correction of the codeword in a plurality of iterations from the number of iterations.

* * * * *